(12) United States Patent
Gelorme et al.

(10) Patent No.: US 6,238,599 B1
(45) Date of Patent: May 29, 2001

(54) HIGH CONDUCTIVITY, HIGH STRENGTH, LEAD-FREE, LOW COST, ELECTRICALLY CONDUCTING MATERIALS AND APPLICATIONS

(75) Inventors: Jeffrey Donald Gelorme, Plainville, CT (US); Sung Kwon Kang, Chappaqua; Sampath Purushothaman, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/877,991

(22) Filed: Jun. 18, 1997

(51) Int. Cl.[7] ............... H01B 1/02; H01C 1/02
(52) U.S. Cl. ........................... 252/514; 252/512
(58) Field of Search .................. 252/512, 514; 205/74

(56) References Cited

U.S. PATENT DOCUMENTS

| | | | |
|---|---|---|---|
| 4,398,975 | * 8/1983 | Ohsawa et al. | 148/400 |
| 5,011,627 | * 4/1991 | Lutz et al. | 252/512 |
| 5,136,365 | * 8/1992 | Pennisi et al. | 357/72 |
| 5,213,715 | * 5/1993 | Patterson et al. | 252/518 |
| 5,286,417 | * 2/1994 | Mahmoud et al. | 252/518 |
| 5,362,421 | * 11/1994 | Kropp et al. | 252/512 |
| 5,372,749 | * 12/1994 | Li et al. | 252/512 |
| 5,431,571 | * 7/1995 | Hanrahan et al. | 439/91 |
| 5,637,176 | * 6/1997 | Gilleo et al. | 156/277 |
| 5,653,918 | * 8/1997 | Towlson | 252/514 |
| 5,686,703 | * 11/1997 | Yamaguchi | 174/259 |
| 5,837,119 | * 11/1998 | Kang et al. | 205/74 |

FOREIGN PATENT DOCUMENTS 57-113505 * 7/1982 (JP).

* cited by examiner

*Primary Examiner*—Mark Kopec
*Assistant Examiner*—John M. Petruncio
(74) *Attorney, Agent, or Firm*—Thomas A. Beck; Daniel P. Morris

(57) ABSTRACT

A structure and method of fabrication are described. The structure is a combination of a polymeric material and particles, e.g. Cu, having an electrically conductive coating, e.g. Sn. Heat is applied to fuse the coating of adjacent particles. The polymeric material is a thermoplastic phenoxy polymer or a styrene allyl alcohol resin. The structure is disposed between two electrically conductive surfaces, e.g. chip and substrate pads, to provide electrical interconnection and adhesion between their pads.

10 Claims, 7 Drawing Sheets

UCAR® PHENOXY RESINS

HIGH CONDUCTIVITY, HIGH STRENGTH, LEAD-FREE, LOW COST, ELECTRICALLY CONDUCTING MATERIALS AND APPLICATIONS

FIELD OF THE INVENTION

The present invention relates to novel interconnection materials for forming electroconductive connections between electroconductive members, and to the method for producing such electroconductive connections. In addition, this invention addresses environmentally-safe materials and processes, which can be an alternative to lead (Pb)-containing solder connection technology.

BACKGROUND

Most electrical conductors used in electronic devices are made of metals, such as copper, aluminum, gold, silver, lead/tin (solder), molybdenum and others. Solder connection technology using lead/tin alloys plays a key role in various levels of electronic packaging, such as flip-chip connection (or C4), solder-ball connection in ball-grid-arrays (BGA), and IC package assembly to a printed circuit board (PCB). Solder joints produced in the electronic packages serve critically as electrical interconnections as well as mechanical/physical connections. When either of the functions is not achieved, the solder joint is considered to have failed, which can often threaten a shut-down of the whole electronic system.

When microelectronic packages are assembled to a printed circuit board, the lead-tin eutectic solder, 63% Sn-37% Pb, having the lowest melting point (183° C.) among Pb—Sn alloys, is most widely used. In these applications, there are two solder connection technologies employed for mass production: plated-through-hole (PTH) and surface mount technology (SMT) soldering. The basic difference between the two technologies originates from the difference in the PCB design and its interconnection scheme.

In SMT soldering, microelectronic packages are directly attached to the surface of a PCB. A major advantage of SMT is high packaging density, which is realized by eliminating most PTH's in the PCB as well as by utilizing both surfaces of the PCB to accommodate components. In addition, SMT packages have a finer lead pitch and a smaller package size compared to traditional PTH packages. Hence, SMT has contributed significantly in reducing the size of electronic packages and thereby the volume of the overall system.

In SMT soldering, solder paste is applied to a PCB by screen printing. Solder paste consists of fine solder powder, flux, and organic vehicles. During the reflow process, solder particles are melted, flux is activated, solvent materials are evaporated, and simultaneously molten solder coalesces and is eventually solidified. In contrast, in the wave soldering process, a PCB is first fluxed and components are mounted on it. Then it is moved over a wave of molten solder.

The soldering process is usually completed by subjecting the solder joints to a cleaning step to remove residual flux materials. Due to environmental concerns, CFCs (chlorofluoro carbons) and other harmful cleaning agents used for this purpose are being eliminated and water-soluble or no-clean flux materials are being used to minimize or eliminate the cleaning steps.

Recent advances in microelectronic devices demand a very fine pitch connection between electronic packages and a printed circuit board (in an order of a few hundred micrometer pitch). The current solder paste technology used in SMT can not handle this very fine pitch interconnection due to the soldering defects such as bridging or solder balling. Another technical limitation of using the Pb—Sn eutectic solder is its high reflow temperature, approximately 215° C. This temperature is already higher than the glass transition temperature of the epoxy resin used in most polymeric printed circuit board materials. Thermal exposure at this reflow temperature produces significant thermal strains in a printed circuit board after soldering, especially in the direction perpendicular to the surface of a PCB, because no structural reinforcement is made in that direction. Thereby, the residual thermal strains in an assembled PCB could significantly degrade the reliability of an electronic system.

A more serious concern regarding the usage of lead (Pb)-containing solders is an environmental issue, a trend already experienced in other industries and has led to the elimination of lead from gasoline and paints.

In the electronic industry, two different groups of materials are investigated currently for the possibility of substituting the Pb-containing solder materials; Pb-free solder alloys, and electrically conductive pastes (ECP). The present invention discusses the development and applications of the electrically conductive paste materials. An electrically conductive paste (or adhesive) is made of metallic filler particles loaded in the matrix of a polymer material. The polymer matrix can be any polymer suitable for use in a paste, for example, a thermoplastic of thermoset. The polymer is selected preferably from the group comprising epoxy, polyester and polyimide. The soluble epoxy, in particular, soluble ketal and a acetal diepoxides, as described in U.S. application Ser. No. 08/210,879, the teaching of which is incorporated herein by reference can also be used as the polymer matrix. Referring to FIG. 1, silver-particle 4 filled epoxy 6 is the most common example of the electrically conductive pastes 2, schematically shown therein as disposed between surface 8 and surface 10. The silver particles usually in the shape of flakes provide electrical conduction by percolation mechanism, while the epoxy matrix provides adhesive bond between the components and a substrate. This silver-filled epoxy material has been long used in the electronic applications as a die-bonding material, where its good thermal conduction rather than electrical conduction property is utilized. However, this material has not been accepted for the applications requiring high electroconduction and fine pitch connection. The silver-filled epoxy material has several limitations, such as low electrical conductivity, increase in contact resistance during thermal exposure, low joint strength, silver migration, difficulty in rework, and others. Since this silver-filled epoxy material is electrically conductive in all the directions, it is classified as "isotropic" in electro-conduction. There is another class of electrically conductive adhesive (or film), which provides electroconduction only in one direction. This class of the materials is known as "anisotropic" conductive adhesive film 12, shown schematically in FIG. 2A, which contains electrically conductive particles 18 in a binder or adhesive material 20. The anisotropic conductive adhesive or film 12 becomes conductive only when it is compressed between two conducting surfaces 22 and 24 as shown in FIG. 2B. This process normally requires heat and pressure. The major application of the anisotropic conductive film is for joining of a liquid crystal display panel to its electronic printed circuit board. The conducting particles 18 are usually deformable, such as solder balls, or plastic balls coated with nickel and gold. The binder or adhesive material 20 is mostly a thermosetting resin.

The ECP made of Sn-plated Cu powder and polyimide-siloxane resin disclosed in our earlier U.S. patent application Ser. No. 08/641,406 filed on May 1, 1996, the teaching of which is incorporated herein by reference, is a good candidate for the high temperature solder joints such as controlled collapse chip connections (C4) and solder ball connection (SBC) to a ceramic substrate. However, for the polymeric printed circuit board applications, this ECP is not adequate, because the reflow temperature such as 250° C. is much higher than the glass transition temperature of the polymeric resin, for example, FR-4. Candidates for this purpose are ECP's made of Cu powder plated with indium, tin-bismuth alloys or indium-tin alloys, formulated with polyimide-siloxane resin. The reflow temperature of these powder pastes is expected to be between 120 and 180° C., which is even lower than the reflow temperature of the Pb/Sn eutectic solder, 215° C.

In an earlier U.S. patent application Ser. No. 08/414,063 filed on Mar. 31, 1995, the teaching of which is incorporated herein by reference, we have disclosed a process to produce dendritic copper powder overcoated with Sn or Sn and BiSn coatings by electrolytic plating on a rigid inert cathode. The morphology of the powder that can be made by this technique is restricted to the dendritic shape which is not always the preferred one for all ECP applications.

A solder/polymer composite paste material is disclosed in U.S. Pat. No. 5,062,896 (Huang et. al.), comprising a major proportion of a meltable solder powder filler, such as Bi—Sn, Pb—Sn, Bi—Sn—Pb alloys, a minor proportion of a thermoplastic polymer such as a polyimide siloxane, and a minor proportion of a fluxing agent. An oxide-free, partially coalesced solder alloy connection is obtained, which is polymer strengthened and reworkable at a low reflow temperature, per se, or in the presence of polymer solvent.

In U.S. Pat. No. 5,286,417 (Mahmoud et. al.), a fusible conductive adhesive is disclosed, which comprises metal alloy fillers such as Sn—Au and Bi—Au, and a thermoplastic polymer having a glass transition temperature overlapping the melting temperature of the metal filler alloys. The loading of the conductive material in the polymer is in the range of about 15% to about 20% by weight.

In U.S. Pat. No. 5,136,365 (Pennisi et. al.), an adhesive material is disclosed, which contains a fluxing agent and metal particles for use in reflow soldering such as Sn, Pb, In, Bi, Sb, Ag and others, in the matrix of an epoxy resin. Upon reflow soldering, the said adhesive forms anisotropic electroconduction between an electrical component and a substrate.

In U.S. Pat. No. 5,213,715 (Patterson et. al.), a directionally conductive polymer is disclosed, which contains a metallic filler powder of Ni or Cu. The metallic powder is treated by a different polymer than the polymer used as a matrix resin. Upon compression, the coated polymer dissolves to make an electrical conduction among the filler particles.

OBJECTS

It is an object of the present invention to provide an electrically conductive paste material which is environmentally safe and low cost.

It is another object of the present invention to provide an electrically conductive paste material which produces a higher electrical conductivity than the conventional silver-filled epoxy does.

It is another object of the present invention to provide an electrically conductive paste material which produces a higher joint strength than the conventional silver-filled epoxy does.

It is another object of the present invention to provide a method of fabricating an electrically conductive paste material which can be processed at a lower temperature than the reflow temperature of Pb—Sn eutectic solder paste.

It is another object of the present invention to provide an electrically conductive paste material which produces a more reliable joint than the conventional silver-filled epoxy does, specifically, in em silver migration.

BRIEF DESCRIPTION OF THE DRAWINGS

Further objects, features, and advantages of the present invention will become apparent from a consideration of the following detailed description of the invention when read in conjunction with the drawing FIGS., in which.

SUMMARY OF THE INVENTION

Figure 1:
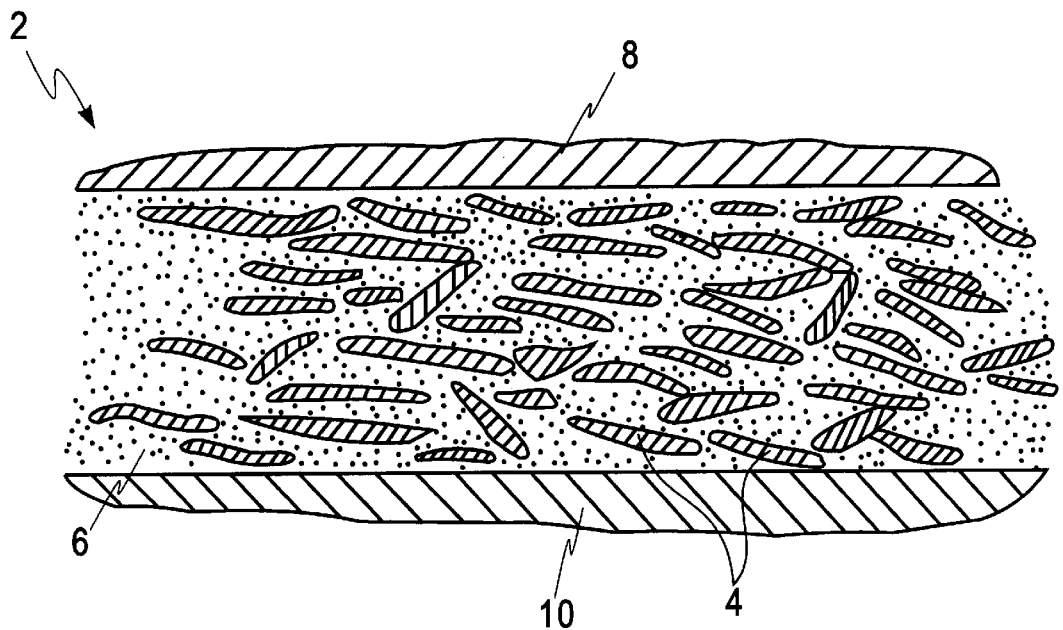
FIG. 1 is a schematic illustration of an electrically conductive paste comprising silver flake particles as a filler in the matrix of epoxy resin. The conductive paste is classified as isotropic in electroconduction.
Figure 2A:
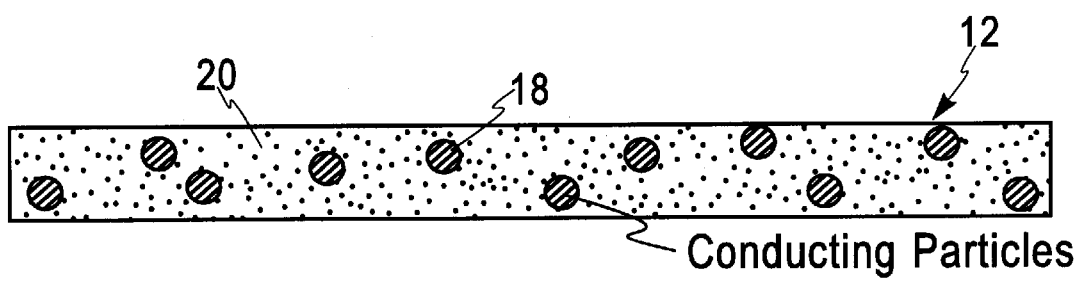
FIG. 2 is a schematic illustration of an electrically conductive adhesive(2A) which becomes electrically conductive only in the one direction when the adhesive film is compressed between two contact or bond pads(2B). The conductive adhesive (or film) is classified as anisotropic.
Figure 2B:
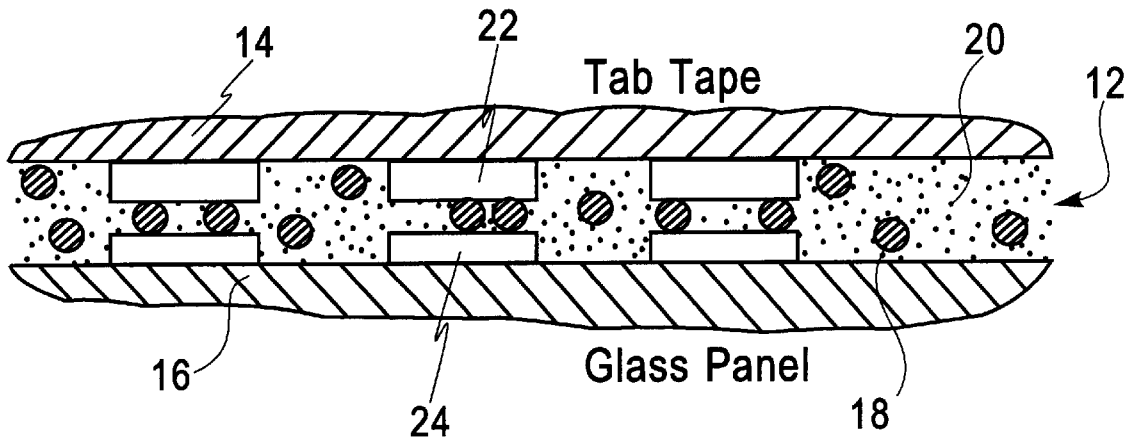

A broad aspect of the present invention is an electrically conductive material formed from a plurality of particles in a thermoplastic phenoxy polymer resin, a polyimide siloxane resin or a styrene allyl alcohol resin, each having an electrically conductive coating which is fused to an electrically conductive coating on an adjacent particle to form a network of fused particles.

Another broad aspect of the present invention is a paste containing particles having a coating of an electrically conductive material and a polymer material.

Another broad aspect of the present invention is a method of forming an electrically conductive joint between two surfaces by forming a paste of particles having an electrically conductive coating and a polymeric material wherein the paste is disposed between two surfaces to be adhesively and electrically joined. Heat is provided to fuse the electrically conductive particles to themselves, to metallurgically bond them to the contact pads and to cure the polymeric material.

DETAILED DESCRIPTION

In one particular embodiment, we disclose a new electrically conductive paste material consisting of tin-coated copper powder, polyimide-siloxane, solvent (N-methyl pyrrolidione or NMP), carboxylic acid/surfactant. A joining operation can be performed near the melting point of Sn, 230° C., where a metallurgical bonding of Sn-to-Sn or Sn-to-Au is accomplished at the particle-to-particle as well as particle-to-substrate pad interfaces. The joining process can be either solid-state or liquid-solid reaction. The polymer curing process can be combined with the joining process depending on the paste formulation. Because of the metallurgical bonding, a higher electrical conductivity is expected with the joints made of the new paste material than with those of the silver-epoxy material. The metallurgical bonds also provide stable electrical conductivity of the new joints upon thermal exposure and cycling. It is also expected to have a higher joint strength from the combined effect of the metallurgical and adhesive bonds. Depending on the applications, the particle size of tin-coated powder, composition of the polymer matrix and volume fraction of the filler material can be adjusted. Since the present conductive paste is primarily based on the metallurgical bonds, the critical volume fraction of the filler material required to achieve acceptable conductivity levels is much less than the conventional Ag-epoxy paste.

In another embodiment, we propose the use of polymer resins prepared from renewable resources or bio-based materials after appropriate functionalization to achieve the desirable thermal and rheological properties, see for example, the final report on NSF Grant # BCS 85-12636 by W. G. Glasser and T. C. Ward. Lignin (by product from paper manufacture), cellulose, wood or crop oils are potential candidates for this purpose. Use of these materials is environmentally preferable because they are derived from natural and renewable resources and can be disposed of more readily at the end of the useful life of the electronic assembly. This is particularly attractive because the use of the Cu—Sn powder eliminates the use of lead (Pb) containing solders and the resulting paste formulation is non-toxic and easy to dispose.

Figure 3:
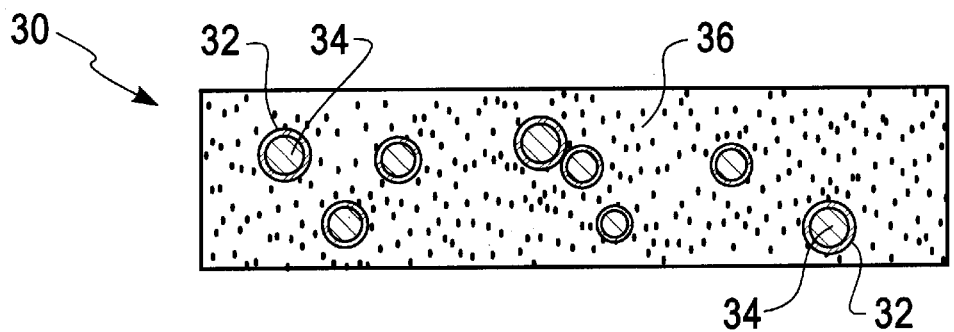
FIG. 3 is a schematic illustration of an electrically conductive paste material, comprising spherical copper powder filled in the matrix of thermoplastic polymer resin. The copper particles are coated with a low melting point, non-toxic metal such as tin, indium, bismuth, antimony or combinations thereof.

FIG. 3 illustrates new electrically conductive paste (ECP) materials 30, according to the present invention, comprising particles 34 having an electrically conducting coating 32, as conducting filler materials, and a polymer matrix 36. The particles 34 are preferably Cu particles. The coating 32 is preferably tin, indium, and bismuth antimony or combinations thereof. The polymer matrix is preferably a thermoplastic, most preferably a polyimide siloxane or phenoxy polymer or styrene allyl alcohol resin. The invention will be described below in terms of the preferred embodiment, but it is not limited thereto.

The first step of tin-plating on copper powder is cleaning of fine copper powder in a dilute sulfuric acid. The copper powder used is spherical in shape, having a size distribution of 2 to 8 $\mu$m in diameter, which was obtained from Degussa Corporation, South Plainfield, N.J. Tin plating is performed on the clean copper powder in an immersion tin plating solution, TINPOSIT LT-34, from Shipley, Newton, Mass. The optimum thickness of tin is 0.3 to 0.5 $\mu$m on 5–7 $\mu$m Cu powder. After rinsing, the tin-plated copper powder is immediately mixed with a no-clean flux, FLUX305, from Qualitek International, Inc., Addison, Ill. This prevents tin-plated copper powder from oxidation until it is processed into a conductive paste. The tin-plated copper powder is formulated into a conducting paste by mixing with polyimide siloxane, or phenoxy polymer or styrene allyl alcohol, NMP solvent or ethyl benzoate, butyric acid and ethylene glycol. The relative amount of filler powder over the polymer matrix is varied from 30 to 90% in weight, depending on the applications. In general, for the isotropic conduction, a high filler weight percent is required, while a low filler weight percent is required for the anisotropic applications. To insure uniform dispersion of the ingredients, the mixture is processed in a three-roll shear mill. The viscosity is also controlled by adjusting the volume fraction of the filler powder in the paste. When the filler weight percent is low, for example, 30% in weight, a solvent drying process, for example, 100° C., 1 hour, is required to adjust the viscosity of the paste before dispensing the paste on to a desired foot print.

In order to characterize the electrical and mechanical properties, joined samples made of the tin-plated copper-filled conductive paste are manufactured by laminating two "L-shaped" copper coupons. The lamination is performed at a temperature slightly above the melting point of Sn, for example, 250° C., at a pressure of 25 psi. In order to compare the conductivity values, other joined samples are also fabricated under the similar process by using commercial Ag-epoxy and Sn/Pb eutectic solder paste materials. The joined samples made of the paste according to the present invention showed the lowest electrical resistance value; for example, $2.6 \times 10^{-5}$ ohm for Sn-plated Cu paste, $4.7 \times 10^{-5}$ ohm for Sn/Pb solder paste, and $7.3 \times 10^{-5}$ ohm for Ag-epoxy for a contact area of about 0.050 inch by 0.050 inch. The resistance of the paste according to the present invention, is even lower than that of the Sn/Pb solder paste. This can be attributed to the difference in the bulk conductivities of copper versus Sn/Pb solder.

Measurements of the joint strength has also demonstrated that the joint made using the paste according to the present invention has a higher joint strength than that made of the Ag-epoxy paste.

Figure 4:
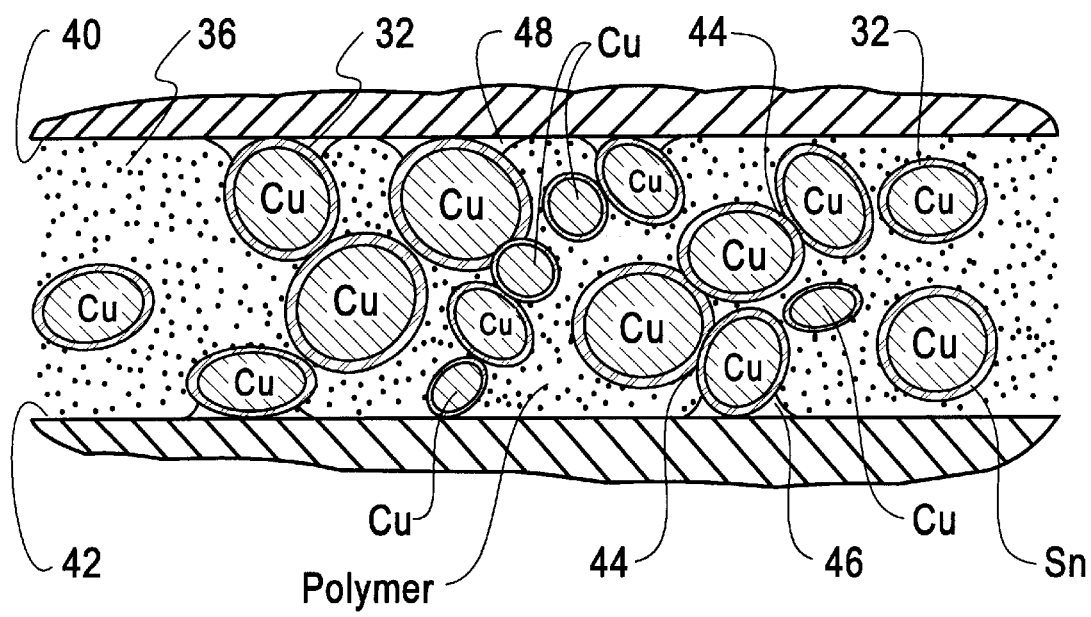
FIG. 4 is a schematic illustration of an interconnection made of the present invention material, specifically comprising copper particles coated with tin metal mixed in the matrix of thermoplastic polymer resin. Metallurgical bonds are formed among the adjacent particles as well as between the contact surfaces and the particles adjacent to these surfaces.

The ECP made of Sn-plated Cu powder and polyimide-siloxane resin or phenoxy polymer or styrene allyl alcohol resin is a good candidate for the high temperature solder joints such as C4 and solder ball connection (SBC) to a ceramic substrate. However, for the polymeric printed circuit board applications, this ECP is not adequate, because the reflow temperature such as 250° C. is much higher than the glass transition temperature of the polymeric resin, for example, FR-4. A candidate for this purpose is an ECP made of Indium-plated Cu powder formulated with polyimide-siloxane OR phenoxy polymer or styrene allyl alcohol resin. The reflow temperature of the Indium-plated Cu powder paste is about 180° C., which is even lower than the reflow temperature of the Pb/Sn eutectic solder, 215° C. Referring to FIG. 4, the paste is disposed between surface 40 and 42 and heated to the reflow temperature, which causes the conductive coating 32 of a particle 34 to fuse to the conductive coating 32 of an adjacent particle to form a bond 44 therebetween. Additionally, metallurgical bonds 46 are also formed between the contact surfaces 42 and the particles adjacent to these surfaces.

In light of the environmental issues, alternative polymer resins made from renewable or bio-based systems such as functionalized lignin, cellulose and wood or crop oils can be also used. These resins are biodegradable or made from non-fossil fuel resources and allow ease of recycling when the electronic assemblies are dismantled at the end of their useful life.

Figure 5:
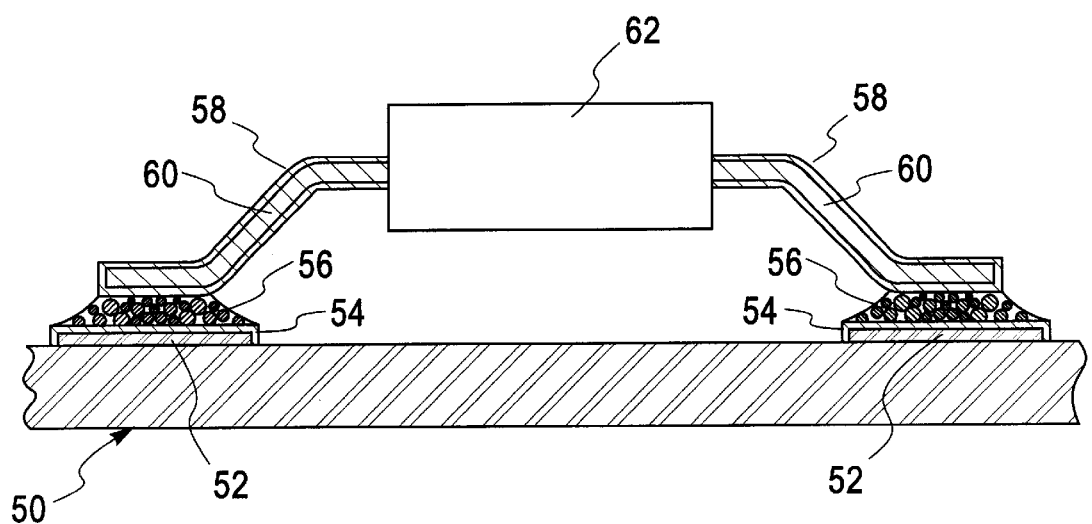
FIG. 5 is a schematic cross-sectional illustration representing a surface mount integrated circuit package connected to a circuit board by an electrically conductive paste according to the invention.

FIG. 5 depicts schematically an IC package attached to a PCB 50 by using a conductive paste according to the present invention. The conductive paste is screen printed on to each copper bond pad 52 on a PCB as practiced with the conventional solder paste. Pad 52 typically has a Sn coating 54. The paste 56 is disposed between Sn 58 coated lead frame 60 which electrically interconnects SMT plastic package 62 to PCB 50. The fine-pitch SMT assembly typically uses a pad spacing of about 0.025" or less. Therefore, the particle size of the tin-coated powder should be in the range of 5 to 10 $\mu$m. The joining operation is combined with the polymer curing process at the temperature between 120 and 150° C. This low temperature process would introduce a much less amount of thermal distortion to the PCB compared to the soldering process. In addition, the joining process is free of external fluxes and no flux cleaning step is required.

Figure 6:
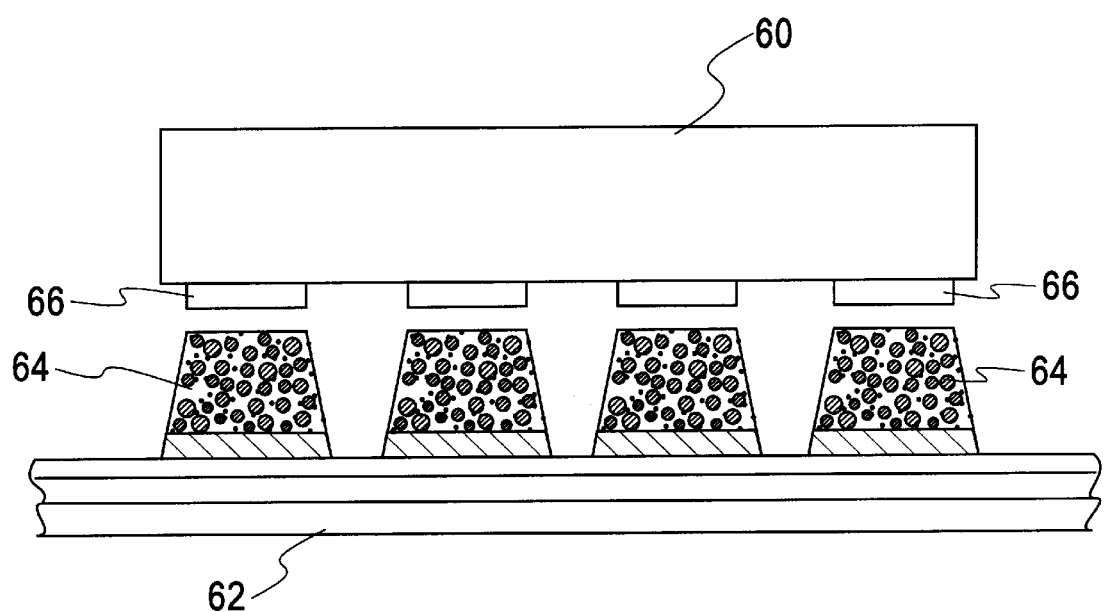
FIG. 6 is a schematic cross-sectional illustration representing an integrated circuit chip directly attached to a high density printed circuit board by using the electrically conductive paste according to the present invention.

FIG. 6 depicts an IC chip 60 attached to a high-density circuit card 62 such as surface laminated circuits (SLC), where the conductive paste material 64, according to the present invention, is dispensed in a two-dimensional array matching the footprint of the chip pads 66. The joining metallurgy on the chip side is preferably Cr/Cu/Au, and Au-to-Sn bond is expected to form at this interface. The electrically conductive joint made of a thermoplastic polymer resin can be reworked by heating to about 200° C. or in the presence of NMP as a solvent. In case of direct chip attachment using C4 solder bumps, an encapsulation process is employed to obtain a desired thermal fatigue resistance of the solder joints. In the present application, the polymer matrix serves as a flexible phase that allows accommodation of the thermal mismatch strains between the substrate and the components. Additionally, one can encapsulate the spaces between the paste pads with a second polymer to further enhance the thermal fatigue resistance if desired.

Figure 7:
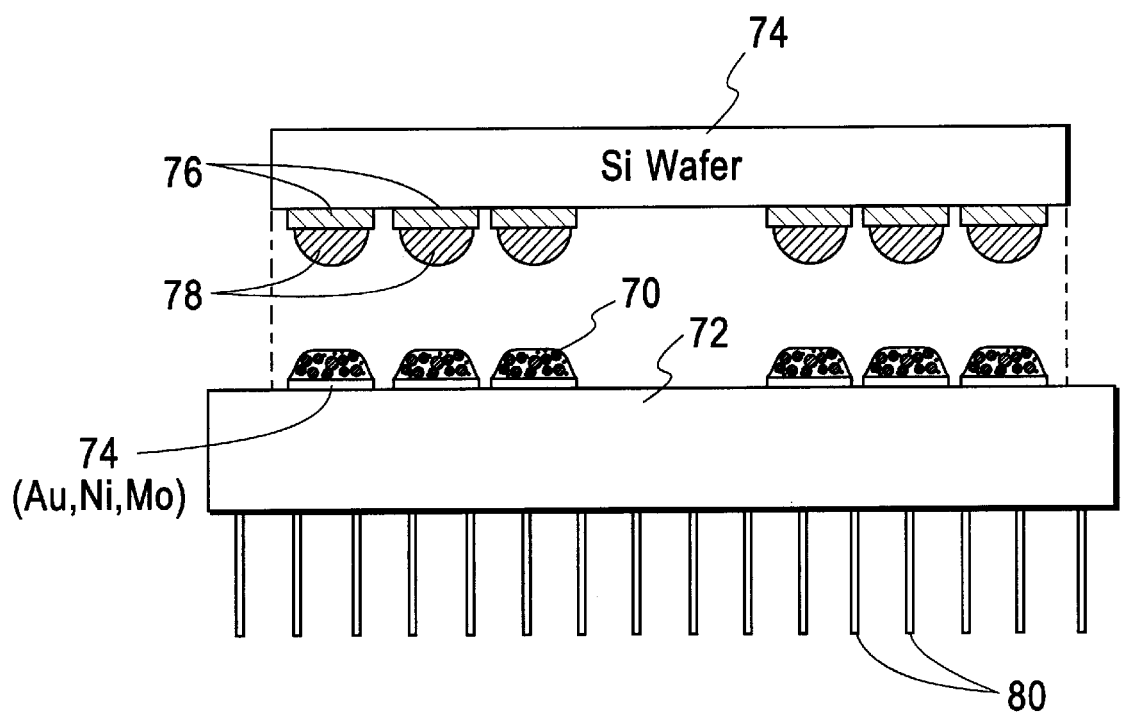
FIG. 7 is a schematic illustration of a multilayer ceramic substrate with the conductive paste structure matching to the C4 bump structure on a silicon wafer. The multilayer ceramic substrate serves as a vehicle for wafer-scale burn-in and chip testing.

FIG. 7 shows an application for wafer-scale burn-in of C4 chips. The conductive paste material 70 is dispensed on a multilayer ceramic substrate 72 whose pad footprint 74 is matched with the silicon wafer pad footprint 76 on which are disposed C4 solder mounds 78 to be tested and burnt-in. The MLC substrate provides interconnects required to power the chips up during burn-in and the external I/O through a pin grid array 80. The conductive paste on the substrate is cured and the Sn-coated particles are bonded together with the C4's on the wafers before the burn-in step. The burn-in operation is performed typically at 150 C, 6 hr. After burn-in, the substrate is separated from the wafer, and can be used again by etching away any residual solder transferred from the C4 bumps during the test, or by dissolving the pads in NMP and re-screening the paste to form new pads. The chip C4 pads themselves would not have changed shape or composition due to the limited metallurgical contact area and pressure between the paste and the solder. Thus one should be able to clean the good chips in a suitable solvent (such as NMP) and assemble them on substrates as per normal process without any problems or added reflow steps.

Figure 8:
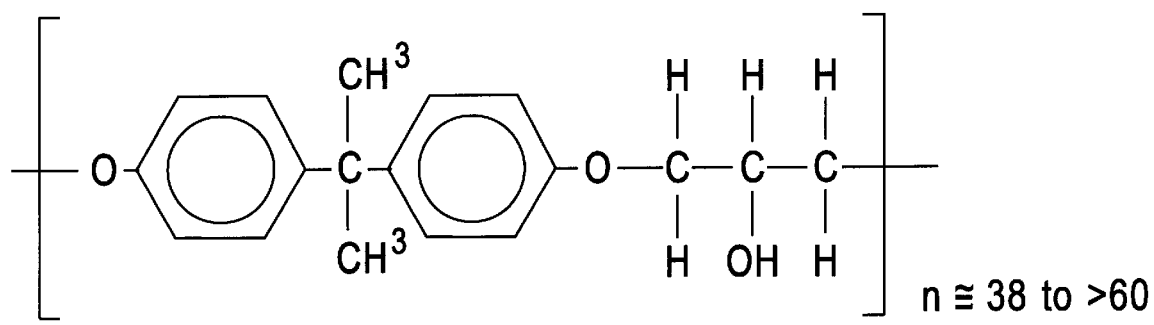
FIG. 8 is a schematic illustration of the chemical molecular structure of thermoplastic phenoxy polymer resins used in the present invention.

FIG. 8 shows a chemical molecular structure of thermoplastic polymer resins useful to produce the present invention. A particular example of which is UCAR phenoxy polymer resins, supplied by Union Carbide Chemicals and Plastics Company, Inc., Danbury, Conn. The phenoxy polymer resins are reported to be tough and ductile thermoplastic with high cohesive strength and good impact resistance. The phenoxy resins are also reported to be thermally stable materials, having a glass transition temperature of 98° C. and a flow temperature of 180° C., which can be processed at high temperature and high speeds. The phenoxy resins have ether linkages and pendant hydroxyl groups that promote wetting and bonding to polar substrates and fillers.

Examples of new electrically conductive paste materials according to the present invention to be used for the applications of surface mount package assembly to a printed circuit board, direct chip attachment to a fine-pitch card, and wafer-scale burn-in of flip chips, in several types of formulations are as follows:

copper powder coated with a thin layer of low melting point, non-toxic metals, such as Sn, In, Bi, Sb, and their alloys, mixed with an environmentally-safe fluxing agent, such as no-clean or water-soluble flux.

tin-coated copper powder, mixed with polyimide siloxane, NMP solvent, and butyric acid and ethylene glycol or no-clean flux.

tin-coated copper powder, mixed with phenoxy polymer, ethyl benzoate, and butyric acid and ethylene glycol or no-clean flux.

tin-coated copper powder, mixed with styrene allyl alcohol resin, and ethyl benzoate, and butyric acid and ethylene glycol or no-clean flux.

tin-coated copper powder, mixed with renewable or bio-based polymer resin, suitable solvent, and butyric acid and ethylene glycol or no-clean flux.

indium-coated copper powder, mixed with polyimide siloxane, NMP solvent, and butyric acid and ethylene glycol or no-clean flux.

indium-coated copper powder, mixed with phenoxy polymer, ethyl benzoate and butyric acid and ethylene glycol or no-clean flux.

indium-coated copper powder, mixed with renewable or bio-based polymer resin, suitable solvent, and butyric acid and ethylene glycol or no-clean flux.

bismuth/tin alloy-coated copper powder, mixed with renewable or bio-based polymer resin, suitable solvent, and butyric acid and ethylene glycol or no-clean flux.

bismuth/tin alloy-coated copper powder, mixed with phenoxy polymer, ethyl benzoate, and butyric acid and ethylene glycol or no-clean flux.

an optimized formulation for the surface mount application, comprising indium-coated copper powder of 30 to 90% in weight, polyimide siloxane, NMP solvent, and butyric acid and ethylene glycol or no-clean flux.

an optimized formulation for the direct chip attach application, comprising indium-coated copper powder of 30 to 90% in weight, polyimide siloxane, NMP solvent, and butyric acid and ethylene glycol or no-clean flux.

an optimized formulation for the burn-in application, comprising tin-coated copper powder of 30 to 90% in weight, polyimide siloxane, NMP solvent, and butyric acid and ethylene glycol or no-clean flux.

phenoxy polymers have general structural formula:

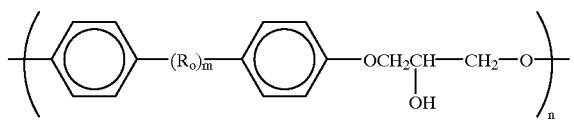

$n > 1$, preferably $2000 \geq n \geq 1$
$m = 0$ or $1$ $R_o$ is

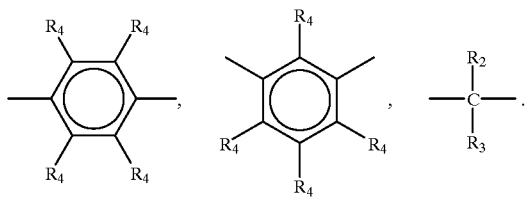

or —O— where $R_2$ and $R_3$ are any organic group, preferably consisting of H, $CH_3$, $C_3 H_{2s+1}$, $CF_3$ where $S \geq 1$, preferably $6 \geq S \geq 1$ where $R_4$ is H or any organic radical.

The conductive pastes according to the present invention can be used as conducting lines, ground planes, and via fills in the conventional printed circuit boards by replacing either the additive or subtractive Cu technology. This will facilitate the elimination of process steps and chemicals thus reducing cost and the environmental impact associated with printed circuit board manufacturing.

While the present invention has been described with respect to preferred embodiments, numerous modifications, changes, and improvements will occur to those skilled in the art without departing from the spirit and scope of the invention.

We claim:

1. A lead-free electrically conductive adhesive paste composition comprising:
   a network of interconnected particles having spaces therebetween;
   each of said particles has a coating thereon of a fusible material;
   adjacent particles in said network are isotropically adhered together through said fusible material, said spaces containing a polymer selected from the group consisting of a thermoplastic phenoxy polymer and a styrene allyl alcohol resin.

2. A lead free electrically conductive adhesive paste composition comprising:
   between about 30% and 90% by weight of the composition of a plurality of particles selected from the group consisting of Cu, Au, Al, Ag, Pd and Pt in a polymer selected from the group consisting of one or more of a thermoplastic phenoxy polymer and a styrene allyl alcohol resin;
   each of said plurality of particles has an isotropic electrically conductive coating selected from the group consisting of Sn, Zn, In, Bi, Pb and Sb; at least some of said particles are fused to other said particles through said electrically conductive coating.

3. The electrically conductive adhesive past composition according to claim 2, wherein said electrically conductive coating has a melting temperature less than that of said particle.

4. A lead free electrically conductive adhesive paste composition comprising:
   particles of copper having a fusible isotropic coating selected from the group consisting of Sn, and In, said particles are contained within a thermoplastic polymer selected from the group consisting of a thermoplastic phenoxy polymer and a styrene allyl alcohol resin, and a solvent.

5. A lead-free electrically conductive adhesive paste composition comprising:
   copper powder coated with a layer of isotropically fusible material selected from the group consisting of Sn, In, Bi, Sb, and combinations thereof in a polymer selected from the group consisting of a thermoplastic phenoxy polymer and a styrene allyl alcohol resin, said coated copper powder being mixed with a fluxing agent in said polymer.

6. The electrically conductive adhesive paste composition according to claim 5, further including NMP solvent, butyric acid and ethylene glycol.

7. The electrically conductive adhesive past composition according to claim 6, wherein said copper powder is from about 30% to about 90% by weight of said structure.

8. A structural formula according to claims 1, wherein said phenoxy polymer has the structural formula:

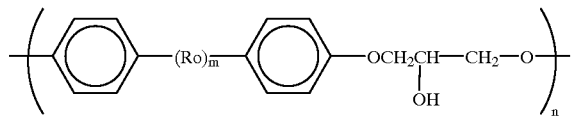

wherein $n > 1$,
$m = 0$, or $1$,
Ro is

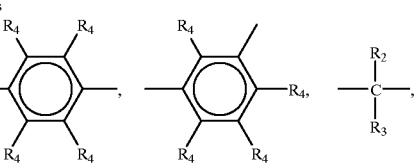

or 0.
where $R_2$ and $R_3$ are any organic group
where $R_4$ is H or any organic radical.

9. The electrically conductive adhesive past composition according to claims 8, wherein said phenoxy polymer has structural formula:

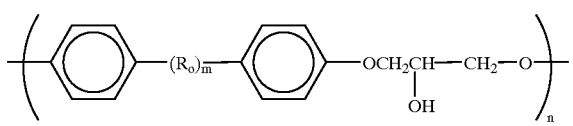

$n > 1$,
$m = 0$ or $1$ $R_o$ is

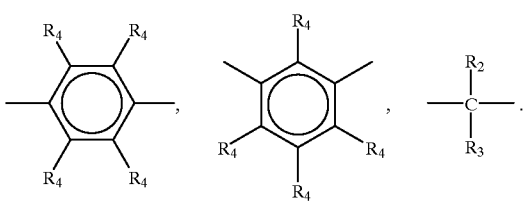

or —O— where $R_2$ and $R_3$ are any organic group.

10. The electrically conductive adhesive past composition of claim 9 wherein $100{,}000 > m > 200$ and $R_2$ and $R_3$ are selected from the group consisting of H, $CH_3$, $C_3 H_{2s+1}$, $CF_3$ where $S \geq 1$, preferably $6 \geq S \geq 1$ where $R_4$ is H or any organic radical.

* * * * *